US012597785B1

(12) United States Patent
Demirjian et al.

(10) Patent No.: US 12,597,785 B1
(45) Date of Patent: Apr. 7, 2026

(54) WATERPROOF MARINE POWER SUPPLY SYSTEM WITH INTEGRATED CONVECTION PASSAGE

(71) Applicant: Brunswick Corporation, Mettawa, IL (US)

(72) Inventors: Gerald J. Demirjian, Auburn, NH (US); Benjamin C. Shaffer, Bedford, NH (US); Ximing He, Auburn, NH (US); Brandon J. Stafford, Manchester, NH (US); Brian R. D'Amelio, Auburn, NH (US)

(73) Assignee: Brunswick Corporation, Mettawa, IL (US)

( * ) Notice: Subject to any disclaimer, the term of this patent is extended or adjusted under 35 U.S.C. 154(b) by 1080 days.

(21) Appl. No.: 17/679,664

(22) Filed: Feb. 24, 2022

(51) Int. Cl.
| | |
|---|---|
| *H05K 7/20* | (2006.01) |
| *B60L 53/20* | (2019.01) |
| *B60L 53/302* | (2019.01) |
| *H02J 7/00* | (2006.01) |
| *H02J 7/02* | (2016.01) |
| *H05K 5/04* | (2006.01) |

(52) U.S. Cl.
CPC ............ *H02J 7/0042* (2013.01); *B60L 53/20* (2019.02); *B60L 53/302* (2019.02); *H02J 7/02* (2013.01); *H05K 5/04* (2013.01); *H05K 7/20409* (2013.01); *H05K 7/209* (2013.01); *H05K 7/20909* (2013.01); *H05K 7/20945* (2013.01); *B60L 2200/32* (2013.01); *B60L*

*2210/30* (2013.01); *B60L 2210/40* (2013.01); *H02J 2207/20* (2020.01); *H02J 2310/42* (2020.01)

(58) Field of Classification Search
CPC ... H05K 7/2089; H05K 7/209; H05K 7/20909
See application file for complete search history.

(56) References Cited

U.S. PATENT DOCUMENTS

| | | | | | |
|---|---|---|---|---|---|
| 4,872,102 | A | * | 10/1989 | Getter | H02M 7/003 |
| | | | | | 361/709 |
| 5,832,988 | A | * | 11/1998 | Mistry | H05K 7/206 |
| | | | | | 165/104.34 |
| 5,930,113 | A | * | 7/1999 | McCann | H05K 7/20409 |
| | | | | | 361/688 |
| 6,145,584 | A | * | 11/2000 | Baynes | H05K 5/06 |
| | | | | | 165/104.19 |

(Continued)

*Primary Examiner* — Adrian S Wilson
(74) *Attorney, Agent, or Firm* — Andrus Intellectual Property Law, LLP

(57) ABSTRACT

A waterproof marine power supply system is provided. The system includes an enclosure defining an interior region and including an upper wall and a lower wall, a first peripheral wall and a second peripheral wall, and a convection passage wall extending within the interior region and separating a convection passage from a component space, where the convection passage extends from a first end to a second end of the enclosure. The component space houses power supply components. The system further includes a first end cap, a second end cap, and a fan coupled to either the first end cap or the second end cap and configured to force a flow of air through the convection passage. The first end cap and the second end cap are coupled to the enclosure such that the component space is sealed against water intrusion and the convection passage is not sealed against water intrusion.

23 Claims, 11 Drawing Sheets

(56)　　　　　　　References Cited

U.S. PATENT DOCUMENTS

| | | | |
|---|---|---|---|
| 6,411,514 B1 * | 6/2002 | Hussaini | ................ H05K 7/209 |
| | | | 361/689 |
| 7,418,995 B2 * | 9/2008 | Howard | ............. H05K 7/20918 |
| | | | 165/80.3 |
| 7,812,487 B2 * | 10/2010 | Bi | ...................... H05K 7/20409 |
| | | | 361/720 |
| 8,816,220 B2 * | 8/2014 | Jones | ...................... H05K 7/202 |
| | | | 174/547 |
| 8,854,816 B2 * | 10/2014 | Shintani | ............. H05K 7/14322 |
| | | | 361/678 |
| 2005/0150634 A1 * | 7/2005 | Howard | ............. H05K 7/20918 |
| | | | 165/80.3 |
| 2010/0059270 A1 * | 3/2010 | Yeh | .................... H05K 7/20136 |
| | | | 174/547 |
| 2010/0273034 A1 * | 10/2010 | Hermann | ................ B60L 50/64 |
| | | | 429/62 |
| 2011/0299265 A1 * | 12/2011 | Nakatsu | ................ H01L 25/072 |
| | | | 361/820 |
| 2013/0343110 A1 * | 12/2013 | Liu | .................... H05K 7/20909 |
| | | | 363/141 |
| 2014/0298846 A1 * | 10/2014 | Taras | ...................... F04B 39/06 |
| | | | 165/185 |
| 2015/0116937 A1 * | 4/2015 | Huesgen | ............. H05K 5/0091 |
| | | | 361/696 |
| 2019/0320555 A1 * | 10/2019 | Flavin | ................ H05K 7/20409 |

* cited by examiner

WATERPROOF MARINE POWER SUPPLY SYSTEM WITH INTEGRATED CONVECTION PASSAGE

FIELD

The present disclosure generally relates to power supply systems, such as marine battery charger or inverter systems, and more particularly to thermal management of such systems.

BACKGROUND

Marine vessels have electrical systems powered by one or more batteries storing electrical power on the boat. The batteries require charging and an on-board marine battery charging system is installed on many marine vessels. On-board marine battery chargers are configured to connect to shore power and facilitate charging the batteries thereby. For example, the shore power outlet may be an AC power outlet that connects to electricity supplied by a power grid. Various power socket arrangements are available for connection to power, such as AC outlets, with corresponding plug standards configured to mate with those sockets to receive power that conforms to a corresponding standard. Various standards are established for mains electricity, or utility power, including a nominal voltage and a frequency. In much of the world, electric power supplied by mains electricity, or utility power, is at a voltage (nominally) of 230 volts and at a frequency of 50 hertz. In North America, AC electric power is typically provided at a frequency of 60 hertz and either 120 volts (most common) or 230 volts.

Various power supply devices and systems are configured to connect to AC power outlets and to distribute electrical power to loads at an appropriate voltage and frequency. For example, battery chargers are configured to receive AC power by connection to an AC power outlet and to deliver DC power to charge a battery. Inverters are another exemplary power supply system, which is a system that changes a DC input to AC. Power inverters are often used in electrical power applications where high currents and voltages are present and where mains electricity is not present. Other types of power supply systems that include converters (including AC/DC and DC/DC), rectifiers, voltage regulators, voltage converters, and the like are well known in the art.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

One embodiment of a waterproof marine power supply system includes an enclosure defining an interior region and having an upper wall and a lower wall, a first peripheral wall and a second peripheral wall, and a convection passage wall extending within the interior region and separating a convection passage from a component space, where the convection passage extends from a first end to a second end of the enclosure. The component space houses multiple power supply components. The system further includes a first end cap, a second end cap, and a fan coupled to either the first end cap or the second end cap and configured to force a flow of air through the convection passage. The first end cap and the second end cap are coupled to the enclosure such that the component space is sealed against water intrusion and the convection passage is not sealed against water intrusion.

In certain examples, the enclosure is fabricated from an extruded metal. In further examples, the extruded metal is aluminum.

In certain examples, the first end cap and the second end cap are fabricated from plastic.

In certain examples, each of the first end cap and the second end cap further comprises either a fan exhaust opening or a fan intake opening formed therein.

In certain examples, the power supply system is a battery charger, and the power supply components are configured to convert an AC power input to a DC power output. In other examples, the power supply system is an inverter, and wherein the plurality of power supply components is configured to convert a DC power input to an AC power output.

In certain examples, no portion of the convection passage wall comprises a touchable surface of the waterproof marine battery charger.

In certain examples, the enclosure further includes a plurality of internal fins extending inwardly to the convection passage from at least one of the lower wall, the first peripheral wall, the second peripheral wall, and the convection passage wall.

In certain examples, the enclosure further includes a plurality of external fins extending outwardly relative to the component space from the lower wall.

In certain examples, the enclosure further includes a plurality of external fins extending outwardly relative to the component space from the first peripheral wall and the second peripheral wall.

In certain examples, the enclosure further includes a plurality of internal fins extending inwardly to the component space from at least one of the first peripheral wall and the second peripheral wall.

In certain examples, the enclosure further includes a pair of mounting flanges extending outwardly from the lower wall.

In certain examples, at least one of the power supply components is thermally coupled to the convection passage wall using a heat sink component and a thermal interface material.

In certain examples, the waterproof marine power supply system further includes a first gasket positioned between the first end cap and the enclosure and a second gasket positioned between the second end cap and the enclosure. In some examples, each of the first gasket and the second gasket comprises a sealing ridge that is configured to extend around a perimeter of the component space and not configured to extend around a perimeter of the convection passage.

In certain examples, the fan is coupled to the first end cap, the fan comprises a plurality of power and signal wires, and the first end cap further comprises a fan wiring pocket proximate the fan. The fan wiring pocket is configured to permit the power and signal wires to pass through a pocket opening into the component space to connect to the fan. In further examples, the fan wiring opening is potted with a potting material to prevent against water intrusion. In still further examples, the potting material is an epoxy.

In some examples, the fan wiring pocket further includes a sensor mounting hole, and the waterproof marine battery charger further includes a temperature sensor coupled to the sensor mounting hole.

One embodiment of a metal enclosure for a power supply system includes an upper wall and a lower wall positioned opposite each other, and a first peripheral wall and a second peripheral wall positioned opposite each other. The upper wall, the lower wall, the first peripheral wall, and the second peripheral wall collectively define an interior region and extend from a first end to a second end. The metal enclosure further includes a convection passage wall extending between the lower wall and either the first peripheral wall or the second peripheral wall. The convection passage wall separates the interior region into a convection passage and a component space, where the convection passage extends from a first end to a second end of the enclosure. The metal enclosure also includes a first plurality of internal fins extending inwardly to the convection passage from at least one of the lower wall, the first peripheral wall, the second peripheral wall, and the convection passage wall.

In certain examples, the metal enclosure further includes a second plurality of internal fins extending inwardly to the component space from at least one of the first peripheral wall and the second peripheral wall.

In certain examples, the enclosure is fabricated from extruded aluminum.

Various other features, objects, and advantages of the invention will be made apparent from the following description taken together with the drawings.

BRIEF DESCRIPTION OF THE DRAWINGS

The present disclosure is described with reference to the following Figures.

DETAILED DESCRIPTION

The present inventors have recognized that increasing charge current output of battery chargers requires increasing the cooling capacity of the charger. Often this cooling capacity is achieved by increasing the surface area of the charger enclosure via the addition of finned surfaces, through the use of a fan, or both. The addition of finned surfaces may be neither thermally efficient nor practically or aesthetically desirable, and the use of fans may compromise the sealing required to protect the electrical components of battery chargers against damage due to water intrusion. The present inventors have recognized and solved these problems in the power supply system disclosed herein. The disclosed system provides a convection passage and associated fan that is fully separate from and having an impermeable boundary with a space in which sensitive electrical components are located. In this way, the sensitive components remain sealed against water intrusion, and additional visually hidden heat dissipating fins may be located within the convection passage to further increase the thermal efficiency of the system.

Figure 1:
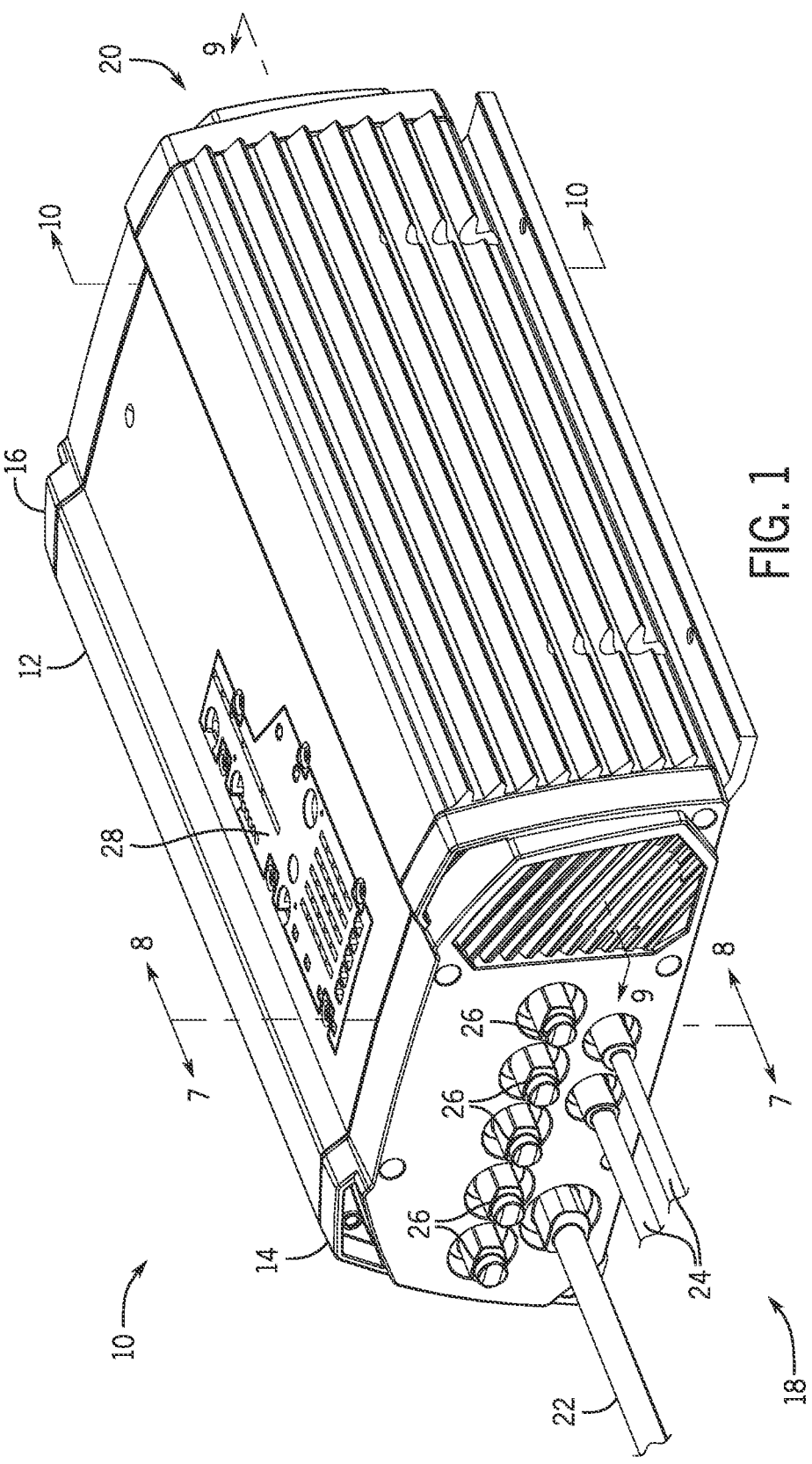
FIG. 1 is a perspective view representation of an exemplary battery charger according to the present disclosure.

FIG. 1 depicts an exemplary marine power supply system 10. The system 10 is shown to include an extruded metal enclosure 12 (described in further detail below with reference to FIGS. 2 and 3) that extends from a first end 18 to a second end 20. A first end cap 14 is coupled to the enclosure 12 at the first end 18, while a second end cap 16 is coupled to the enclosure 12 at the second end 20. A variety of electrical components required to carry out the functions of the power supply system 10 (e.g., converting an AC power input to a DC power output, or a DC power input to an AC power output) may be housed within the enclosure 12.

In the embodiments depicted in FIGS. 1-11, the system 10 is a marine battery charger system configured to be installed on a marine vessel to charge one or more marine batteries using shore power. Marine batteries may be configured to power a marine drive on the marine vessel, such as an electric trolling motor or other electric motor. Alternatively or additionally, the marine battery may be configured to charge engine starting batteries, and/or power other devices on the marine vessel, such as steering systems, navigation systems, other house loads, etc. As will be understood by a person having ordinary skill in the art, the battery may be a single battery, such as a lead-acid battery or a lithium-ion battery, or may be a bank of batteries.

In other embodiments, the system 10 is an inverter system configured to be installed on a marine vessel to provide AC power for appliances from DC power supplied by the one or more marine batteries. In still further embodiments, the power supply system 10 is a charger or inverter that is not installed on a marine vessel, but rather is installed in another location subject to harsh environmental conditions (e.g., recreational vehicles, industrial settings). For example, cart pushers and forklifts may utilize similarly high powered battery chargers as those utilized on marine vessels. These chargers may be installed in factories or warehouses that undergo routine cleaning using pressure washers or the like. Accordingly, the chargers must be sufficiently sealed against water intrusion to prevent damage to the electrical components housed in the charger.

Still referring to FIG. 1, the battery charger system 10 is shown to include a AC cable input 22 configured to be coupled to an AC power source (e.g., shore power), two additional communication interfaces 24 that are configured to output charger and battery statuses to remote devices, and five DC output connectors 26. Accordingly, the battery charger system 10 depicted in FIGS. 1-11 is capable of charging five batteries independently via the output connectors 26 without the need to connect one or more batteries to each other. In this way, the battery charger system 10 is able to charge a greater number of marine batteries more quickly than a charging system that includes fewer output connectors. As described below, the heat conductive and convective features of the battery charger system 10 are able to efficiently manage the heat generated by the charger system 10 when connected to five batteries. According to an exemplary embodiment of the present disclosure, the battery charger system 10 may be configured to output 50 Amps continuously via the output connectors 26.

An indicator assembly 28 is also shown to be coupled to the enclosure 12. The indicator assembly 28 may include a variety of LED indicator lights that indicate a fault status and a mode of operation for the battery charger system 10. For example, in an exemplary embodiment, the charger system 10 may be operable in a diagnostic mode, a charging mode, a conditioning mode, or a maintenance mode. In addition, one or more LED indicator lights on the indicator assembly 28 may be configured to indicate that the system 10 is connected to AC power via the AC cable input 22, and that one or more batteries are connected to the DC output connectors 26 and charging. Further components of the indicator assembly may include state of charge (SOC) indicators, connected battery voltage indicators, selected chemistry indicators, communication IDs, and power-charge buttons.

Figure 2:
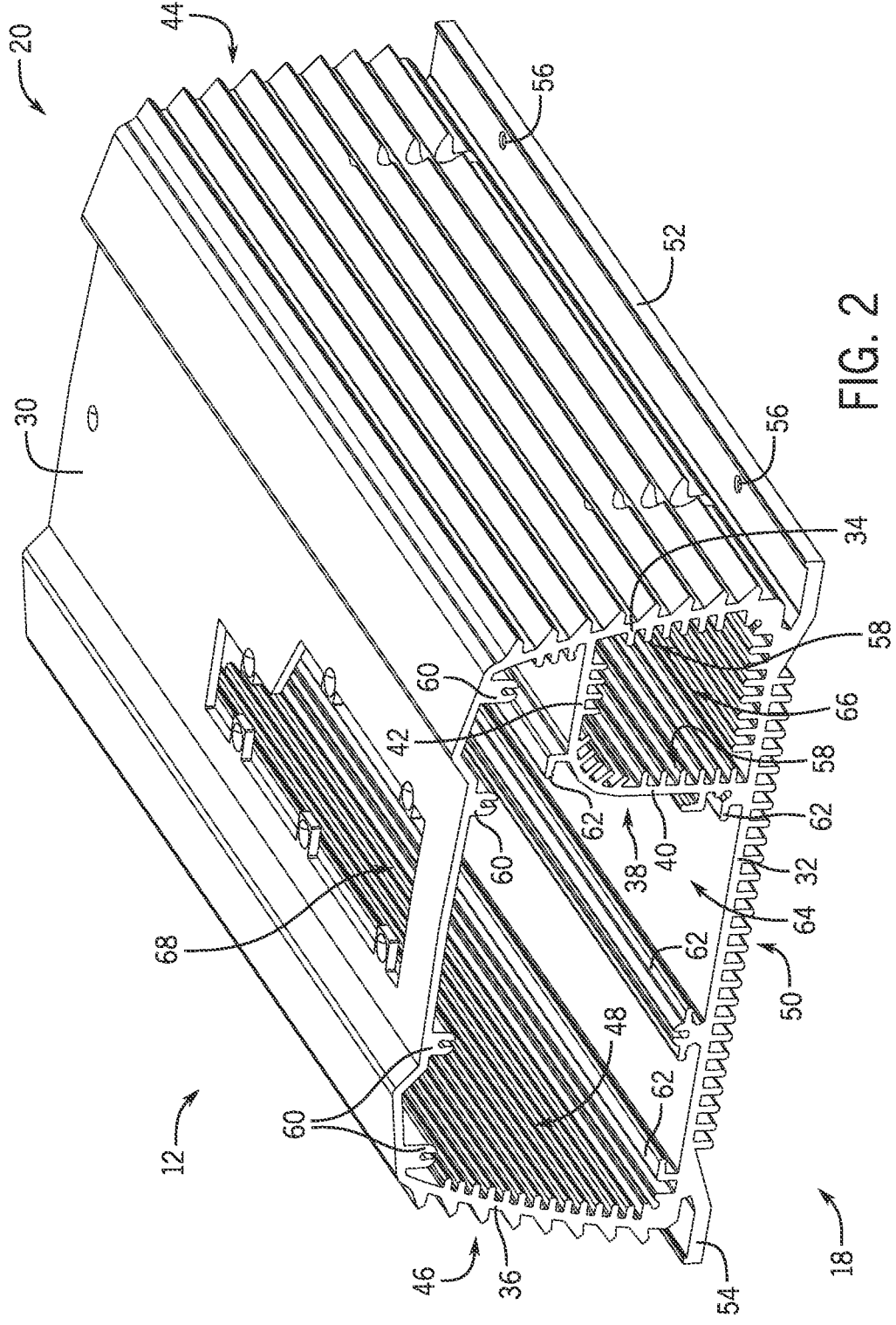
FIG. 2 is a perspective view representation of an extruded enclosure used in the battery charger of FIG. 1.
Figure 3:
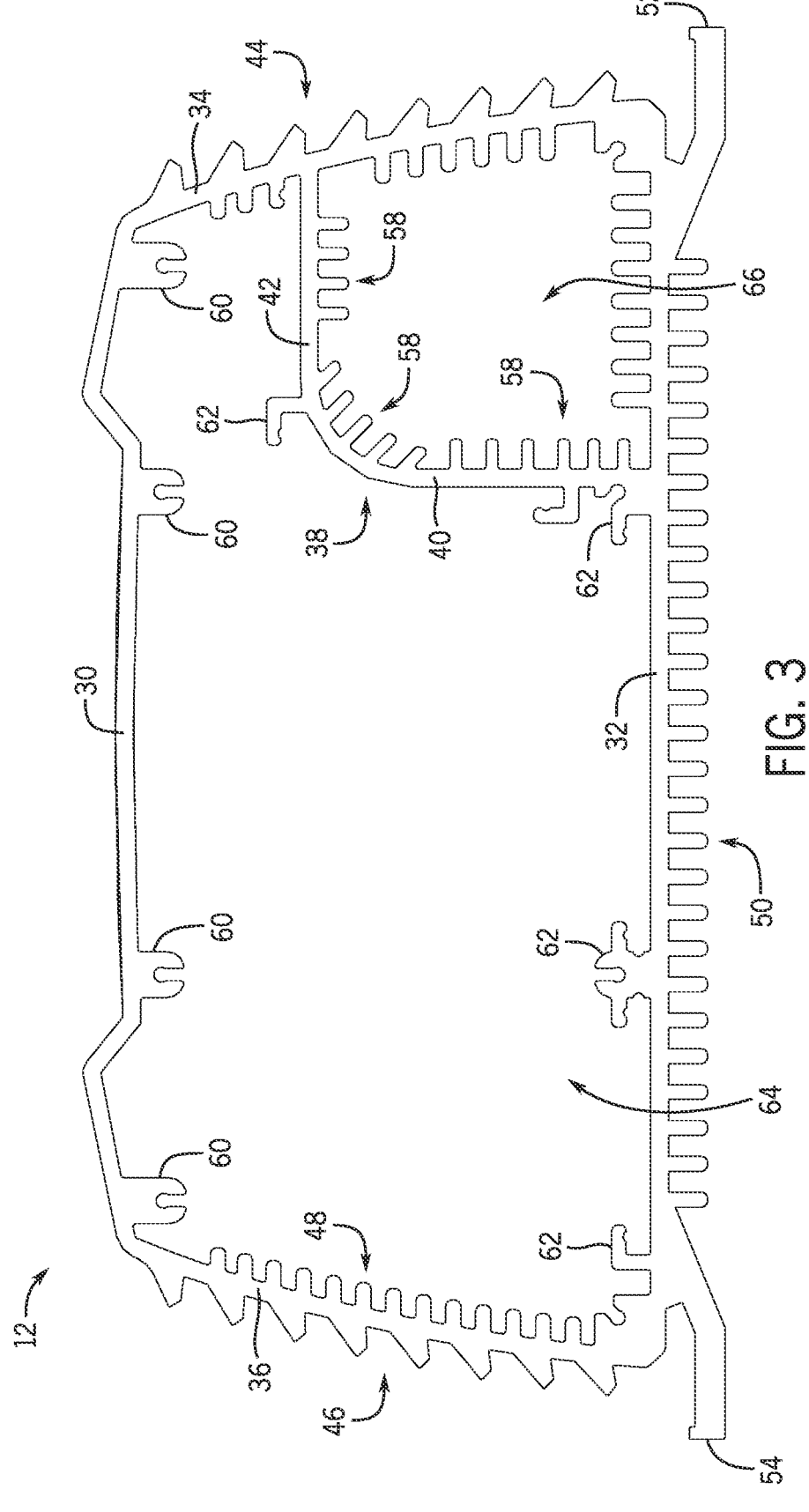
FIG. 3 is a side view representation of the extruded enclosure of FIG. 2.

Referring now to FIGS. 2 and 3, perspective and side views of the extruded enclosure 12 are respectively depicted. The enclosure 12 is shown to be a tubular structure with a generally rectangular cross-section, including an upper wall 30 that opposes a lower wall 32, and a first peripheral wall 34 that opposes a second peripheral wall 36. A first mounting flange 52 is shown to extend outwardly from the lower wall 32 near the first peripheral wall 34, and a second mounting flange 54 is shown to extend outwardly from the lower wall 32 near the second peripheral wall 36. Each of the mounting flanges 52, 54 may include multiple mounting holes 56 used to secure the system 10 such that it is fixed in place on a structure (e.g., by screws, hooks, Velcro, or other fasteners) within the marine vessel. In some embodiments, U-shaped cuts in the enclosure 12 may be located above the mounting holes 56 to aid in the coupling of fasteners to the mounting holes 56.

The walls 30, 32, 34, and 36 define an interior region of the enclosure 12. A convection passage wall 38 is shown to extend continuously between the lower wall 32 and the first peripheral wall 34 and to include a generally vertical portion 40 and a generally horizontal portion 42 that is orthogonal to the vertical portion 40. The convection passage wall 38 separates the interior region into a component space 64 and a convection passage 66, wherein the convection passage 66 extends at least substantially the length of the enclosure 12 from the first end 18 to the second end 20. As described in further detail below, the component space 64 houses all of the electrical components required to complete the functions of the power supply system 10, and is therefore sealed against water intrusion to prevent damage to the electrical components. In other embodiments, the convection passage wall 38 may be positioned in a different orientation within the interior region of the enclosure 12. For example, the convection passage wall might extend substantially vertically from the lower wall 32 to the upper wall 30, or it may be generally arc-shaped and both extend from and terminate on the lower wall 32, or one of the peripheral walls 34, 36. As will be described in greater detail below with reference to FIGS. 5-9, the location of the convection passage wall 38 defining the convection passage 66 corresponds with the position of a fan (e.g., fan 102) that is mounted in the first end cap 14 and is configured to drive a flow of air through the convection passage 66 to cool the electrical components housed within the component space 64.

Advantageously, the convection passage wall 38 is completely internal to the enclosure 12 such that when the end caps 14, 16 are coupled to the enclosure 12 (see FIG. 1) an operator is prevented from touching any portion of the convection passage wall 38. As will be known to a person of ordinary skill in the art in view of the present disclosure, battery chargers and inverters are required to comply with regulations dictating the maximum temperature of the enclosure of the charger—e.g., regulations dictating that a maximum surface temperature of the exterior surface of the charger enclosure not exceed 70° C. to avoid causing burns or injury to users who may touch or otherwise come in contact with the enclosure 12. The surface temperature may be determined by actual measurement of temperature at or near the external surface of the enclosure 12, or by temperature measurement at another location within the system and using a thermal model to indirectly determine or estimate the external temperature of the enclosure. By locating the convection passage wall 38 such that no part of the wall is a touchable surface, it is possible to efficiently direct heat away from the highest power-dissipating electrical components within the component space 64 without posing a risk to the operator.

To aid in the convection cooling of the electrical components within the component space 64, the enclosure is shown to include multiple sets of internal and external cooling fins. As will be known to a person of ordinary skill in the art in view of the present disclosure, cooling fins permit conduction heat transfer to diffuse heat away from electrical components and increase the surface area of a conductive component, thereby increasing convection heat transfer as compared to a flat (i.e., non-finned surface). In accordance with these principles, sets of external fins 44 and 46 are shown to extend outwardly from the peripheral walls 34 and 36 respectively, and an additional set of external fins 50 is shown to extend outwardly from the lower wall 32. In addition to these external fins, the enclosure 12 is shown to include a set of internal fins 48 extending inwardly from the second peripheral wall 36 and positioned opposite the convection passage wall 38. As described in further detail below, the presence of the internal fins 48 may ensure proper balance of the enclosure 12 during an extrusion process. An additional set of internal fins 58 is shown to extend inwardly from the lower wall 32, the first peripheral wall 34, and the convection passage wall 38 into the convection passage 66. The arrangement of external and internal fins depicted in FIGS. 2 and 3 is merely exemplary, and in other embodiments, different arrangements of fins and fin geometries may be provided on the enclosure 12.

Still referring to FIGS. 2 and 3, a set of upper mounting prongs 60 is shown to extend from the upper wall 30, while a set of lower mounting prongs 62 is shown to extend from the lower wall 32 and the convection passage wall 38. The lower mounting prongs 62 may be configured to receive and locate various components housed within the enclosure 12, for example, electrical components mounted on circuit card assemblies and internal heat sinks used to direct heat away from those electrical components (see FIG. 8). In addition, portions of the mounting prongs 60, 62 may include threaded holes such that threaded fasteners (e.g., screws, bolts) may be utilized to retain the end caps 14, 16 in a coupled arrangement with the enclosure 12.

In an exemplary implementation, the enclosure 12 is fabricated from extruded aluminum. The present inventors have recognized that aluminum exhibits favorable heat transfer characteristics relative to its strength and weight. In other embodiments, the enclosure 12 may be fabricated from magnesium, copper, or plastic. The present inventors have further recognized that certain features may be incorporated into the design of the enclosure 12 to achieve a high quality extruded part. For example, the internal fins 48 extending from the second peripheral wall 36 and opposite the convection passage wall 38 may be incorporated into the design primarily to balance the part and prevent tool misalignment during the extrusion process. In still further embodiments, a different fabrication process may be utilized for the enclosure 12, for example, die casting or injection molding. In addition, some features of the enclosure 12 may not be formed during an extrusion process. For example, an indicator assembly mounting hole 68 formed in the upper wall 30 may be machined after the extrusion process is completed.

FIGS. 4-7 depict aspects of the first end cap 14 and its coupling to the enclosure 12. In an exemplary implementation, both the first end cap 14 and the second end cap 16 (see FIGS. 1 and 9-11) are fabricated from plastic using an injection molded process. The end caps 14, 16 may be fabricated from plastic rather than metal because it is cheaper, lighter, and easier to fabricate due to the complex geometry of the end caps 14, 16.

Figure 4:
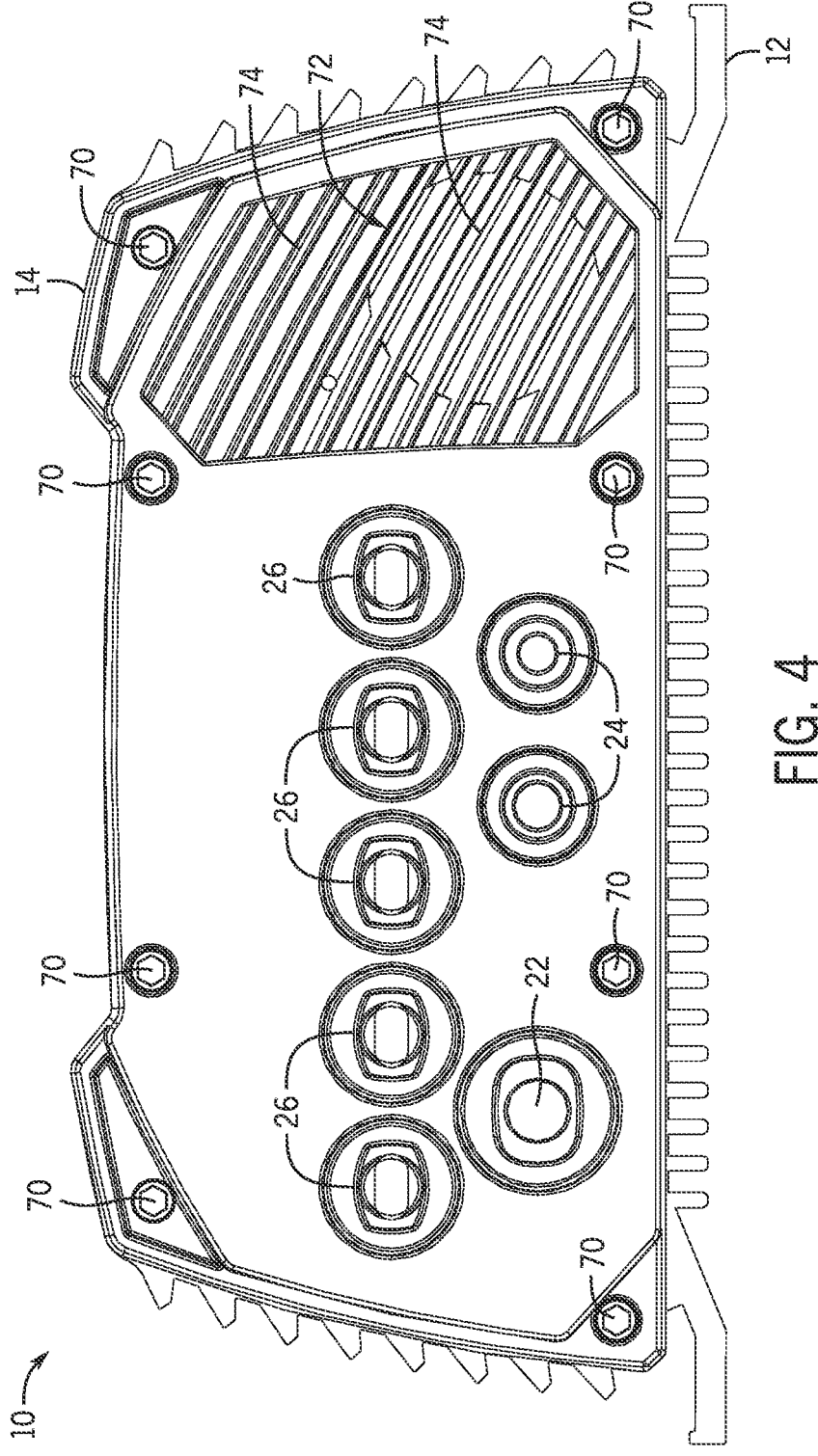
FIG. 4 is a side view representation of the battery charger of FIG. 1 including a first end cap.

As shown in the side view of the charger system 10 depicted in FIG. 4, the first end cap 14 may be coupled to the enclosure 12 using multiple fasteners 70 that are received by threaded holes formed in the mounting prongs 60, 62 (see FIGS. 2 and 3). The first end cap 14 is further shown to include a fan intake/exhaust opening 72 positioned to the right of the cables and connectors 22-26. The fan intake/exhaust opening 72 may include multiple louvers 74 configured to visually obstruct the opening 72 such that air can easily flow through opening 72, while at the same time, debris is largely prevented from flowing into the charger system 10, and the convection passage 66 is not clearly visible to an operator when the end cap 14 is coupled to the enclosure 12.

Figure 5:
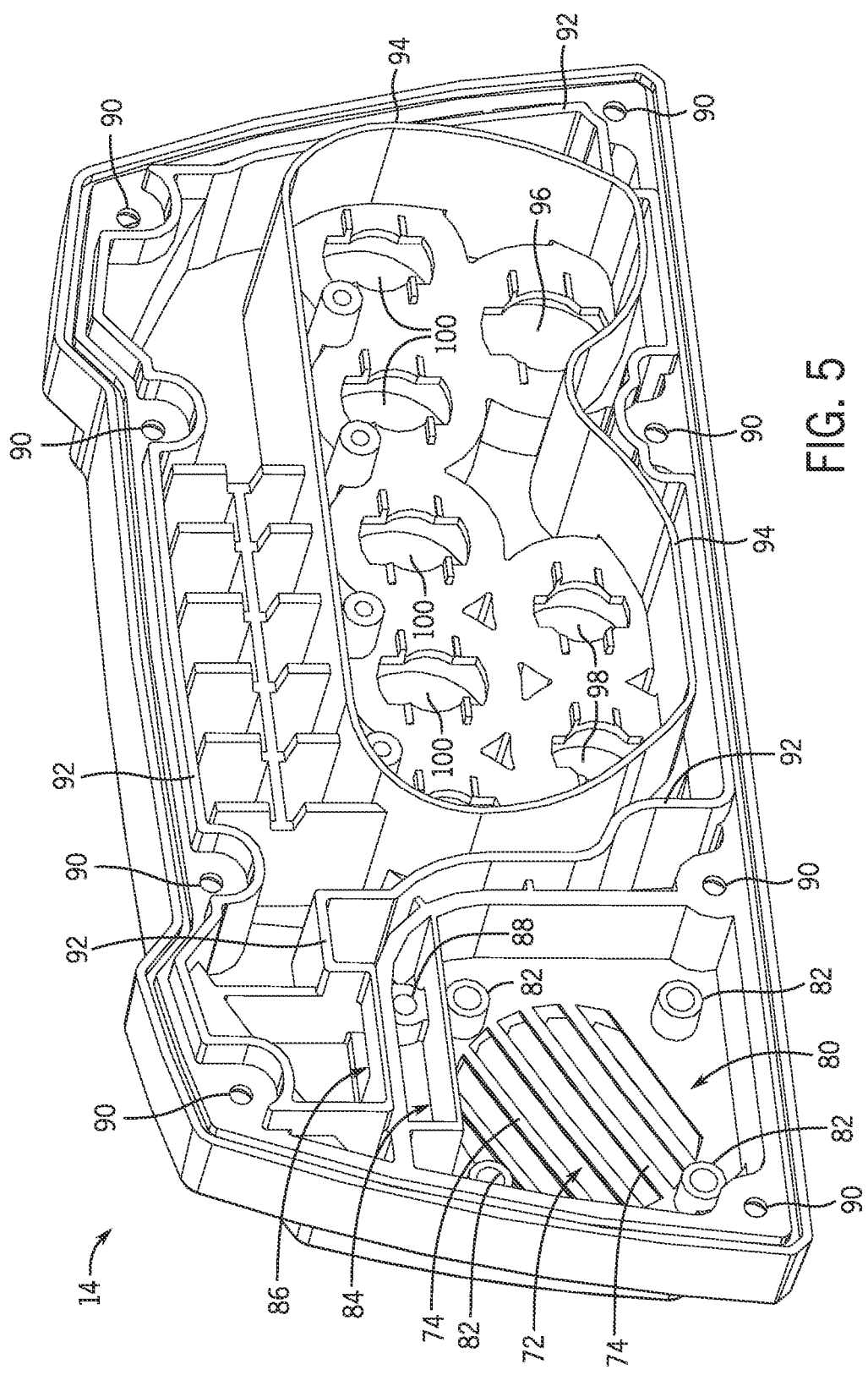
FIG. 5 is a perspective view of the first end cap of FIG. 4.

An interior view of the end cap 14 (i.e., the portion of the end cap 14 that faces the enclosure 12) is depicted in FIG. 5. The end cap 14 is shown to include a fan mounting pocket 80 aligned with the fan intake/exhaust opening 72. Four fan mounting bosses 82 are shown to surround the fan mounting pocket 80. In an exemplary embodiment, the fan mounting bosses 82 include threaded openings configured to receive threaded fasteners that couple the fan to the end cap 14 (see FIGS. 6 and 7 below). A temperature sensor mounting boss 88 (see FIG. 6 below) may be positioned in a fan wiring pocket 84 above the fan mounting pocket 80. The fan wiring pocket 84 may include a fan wiring opening 86 that permits signal and power wiring emanating from the fan to connect to the electrical components housed within the component space 64 of the enclosure 12.

The first end cap 14 is further shown to include a connector wall 94 surrounding multiple openings 96, 98, 100 formed in the end cap 14 for the AC and DC cables and connectors 22-26. The connector wall 94 may serve to protect the cables and connectors 22-26 against water intrusion and other physical damage. A gasket wall 92 is positioned outside the connector wall 94 and around multiple fastener holes 90 formed in the first end cap. As described in further detail below with reference to FIG. 7, the gasket wall 92 is configured to fit within and provide structure to a gasket having a raised portion that fits around a perimeter of the component space 64 to seal the component space against water intrusion. Threaded fasteners (e.g., fasteners 110, depicted in FIG. 7) may pass through the fastener holes 90 to retain the end cap 14 on the enclosure 12 in a coupled arrangement.

Figure 6:
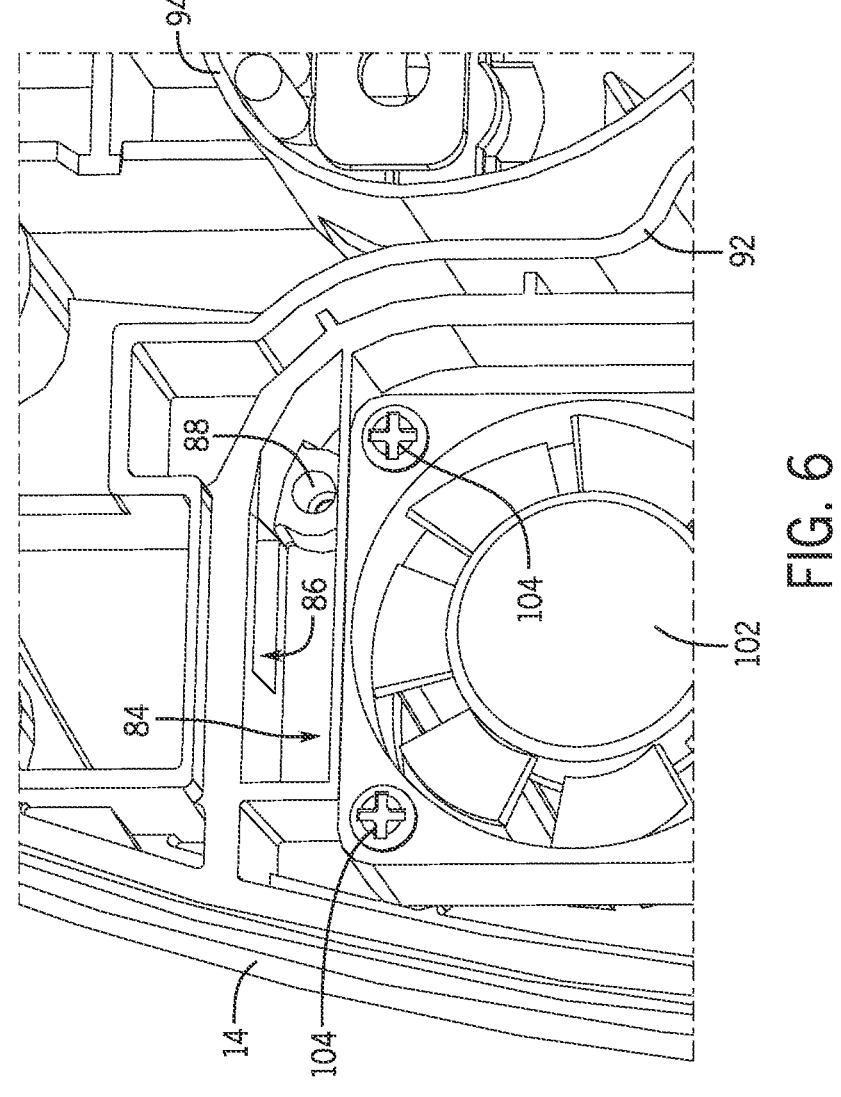
FIG. 6 is a detail view of a cooling fan installed in the first end cap of FIG. 5.

FIG. 6 depicts a detail view of a fan 102 installed in the fan recess 80 using threaded fasteners 104 that are received by fan mounting bosses 82. As described above, the fan 102 may be configured to force air through the convection passage 66 to cool the electrical components of the system 10. In an exemplary implementation, the fan 102 is a waterproof fan that utilizes sleeve bearings rather than ball bearings. Control of the fan 102 (e.g., on/off operation, rotational speed) may be provided by a microcontroller or other programmable control device that is mounted on an epoxy-coated circuit board. The epoxy may be provided to prevent a short circuit condition due to water intrusion near the fan 102.

A temperature sensor (not shown) may be mounted within the sensor mounting boss 88 formed in the fan wiring pocket 84 using an adhesive or another type of fastener. A controller located within the component space 64 may be configured to receive a measured ambient temperature from the temperature sensor in order to control electrical components within the component space 64 and/or the fan 102 based thereon. For example, ambient temperature sensing may be utilized to tune charging voltages for different temperatures (e.g., increasing charging voltage for lead acid batteries when the ambient temperature is lower). The present inventors have recognized that by placing the temperature sensor outside of the flow path of the forced air provided by the fan 102, the ambient temperature measurements of the temperature sensor are not unduly affected by the heat of the charger system 10 due to the steady supply of air by the fan 102. In order to protect the temperature sensor and the fan wiring against water intrusion, the fan wiring pocket 84 may be potted with a potting compound (e.g., epoxy).

Figure 7:
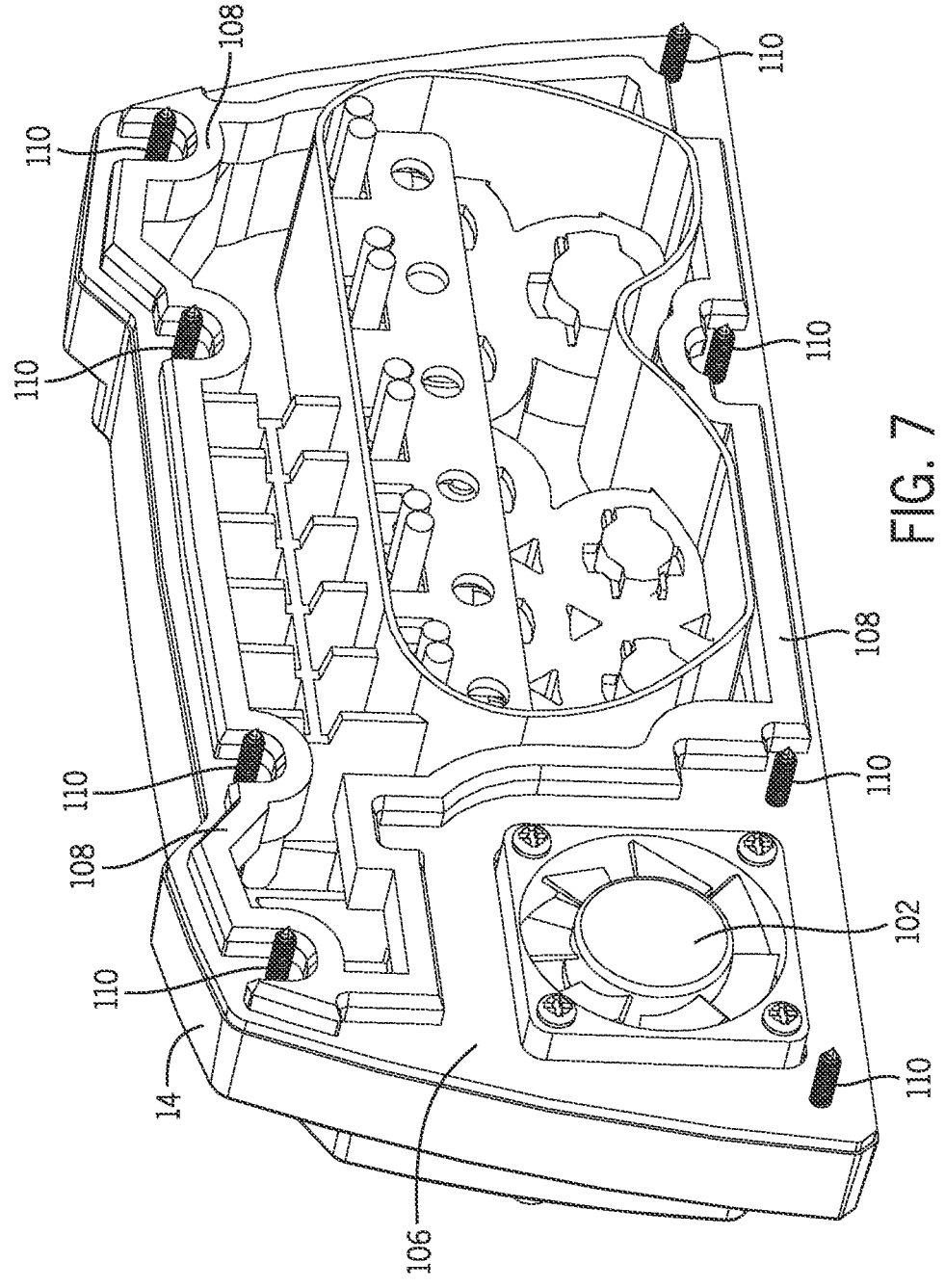
FIG. 7 is a cross-sectional view of the battery charger taken along the line 7-7 of FIG. 1.
Figure 8:
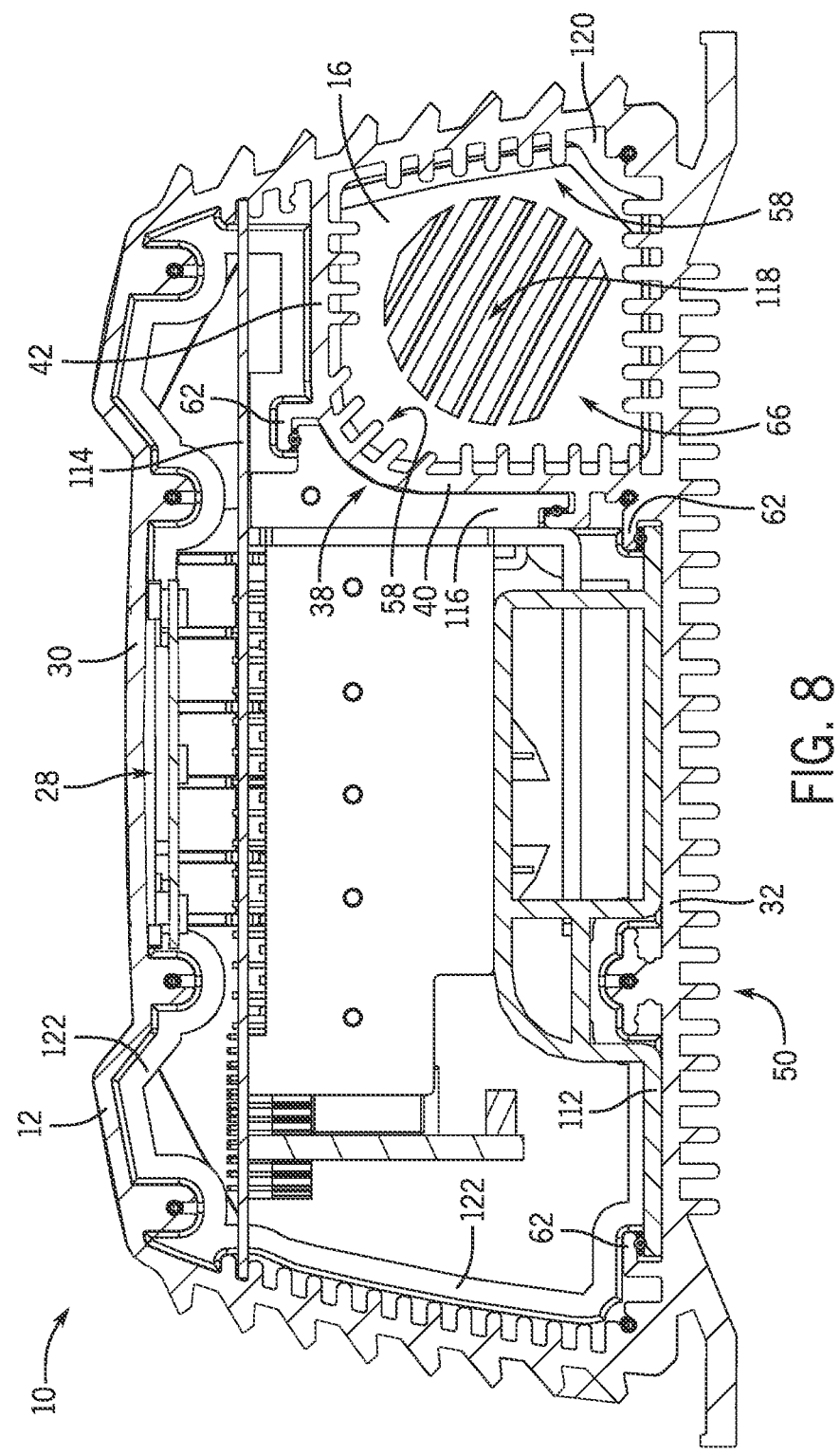
FIG. 8 is a cross-sectional view of the battery charger taken along the line 8-8 of FIG. 1.

FIG. 7 depicts the coupling of a sealing gasket 106 and threaded fasteners 110 to the first end cap 14. The sealing gasket 106 is shown to include a raised sealing ridge 108 that matches the contours of the gasket wall 92 (see FIG. 5). In an exemplary embodiment, the sealing ridge 108 does not extend around the convection passage 66, as the convection passage 66 is not scaled against water intrusion. A side cross-sectional view of the system 10 taken along the line 8-8 is depicted in FIG. 8. As shown, the present inventors have arranged the internal electrical components, including a main circuit card assembly 114, such that heat generated by the electrical components can be efficiently conducted to highly-finned surfaces of the enclosure 12. For example, internal heat sink 112 may be thermally coupled to the lower wall 32 having external fins 50, and internal heat sink 116 may be coupled to the vertical portion 40 of the convection passage wall 38 having fins 58. A transformer may be thermally coupled to the internal heat sink 112. The internal heat sink 116 may be configured such that one or more high power dissipating components (e.g., a MOSFET) are thermally coupled to the convection passage wall 38. As described above, by mounting the components in this way, the risk of a touchable surface temperature exceeding a maximum limit is significantly reduced or eliminated, the heat of the MOSFET does not contribute to the heat dissipated by the transformer. In an exemplary implementation, thermal interface material (e.g., thermal grease, compressible foam, not shown) may be positioned between the internal heat sinks 112, 116 and the walls 32, 38 to mitigate the thermally insulating effects of air between the sinks 112, 116 and walls 32, 38.

Figure 10:
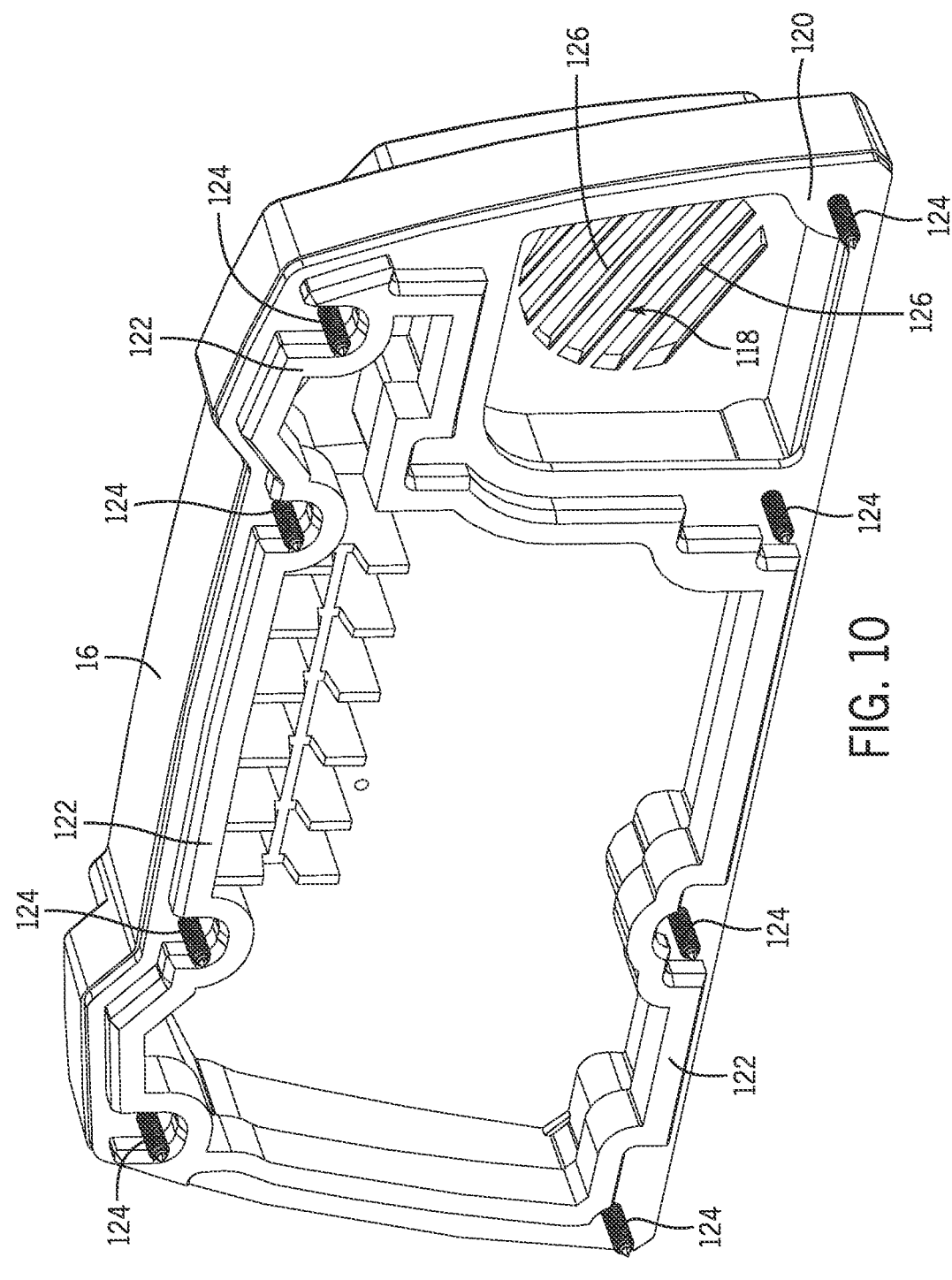
FIG. 10 is a cross-sectional view of the battery charger taken along the line 10-10 of FIG. 1.
Figure 11:
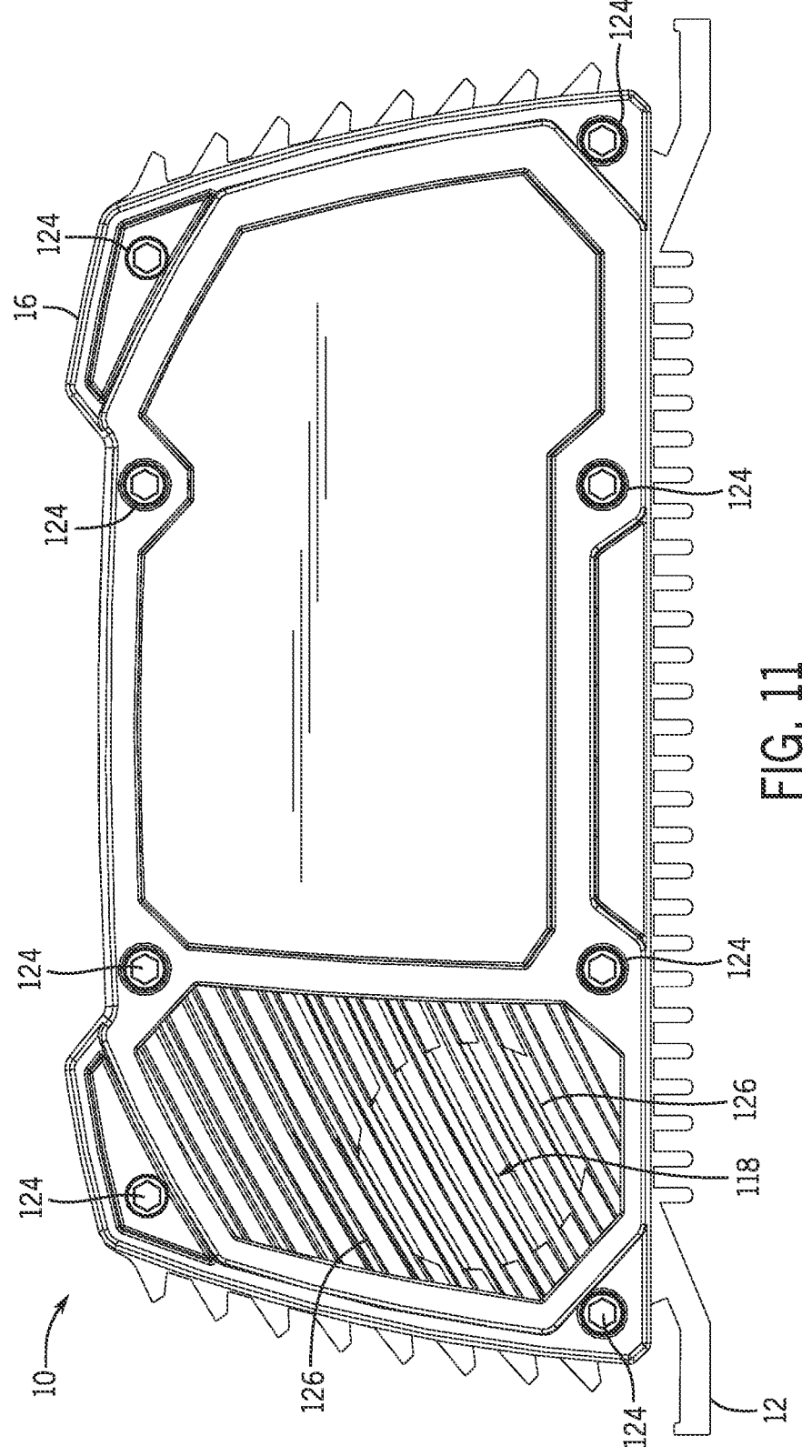
FIG. 11 is a side view representation of the battery charger of FIG. 1 including a second end cap.

FIG. 8 further depicts the second end cap 16 as coupled to the enclosure 12 as viewed from the perspective of the first end cap 14. In an exemplary embodiment, the second end cap 16 is coupled to the enclosure 12 using multiple threaded fasteners 124 (see FIG. 10). Similar to the arrangement at the first end cap 14, the second end cap 16 is shown to include a fan intake/exhaust opening 118 aligned with the convection passage 66. As best shown in FIGS. 10 and 11, a least of portion of the fan intake/exhaust opening 118 is visually obstructed by louvers 126 that permit the flow of air but inhibit the flow of debris into the system 10. The louvers 126 further ensure the convection passage 66 is not clearly visible to an operator when the end cap 16 is coupled to the enclosure 12. In addition, a gasket 120 is positioned between the second end cap 16 and the enclosure 12. A raised sealing ridge 122 of the gasket 120 is shown to extend around the perimeter of the component space 64 to prevent water intrusion into the component space 64. The sealing ridge 122 does not extend around the convection passage 66, as the convection passage 66 is not sealed against water intrusion.

Figure 9:
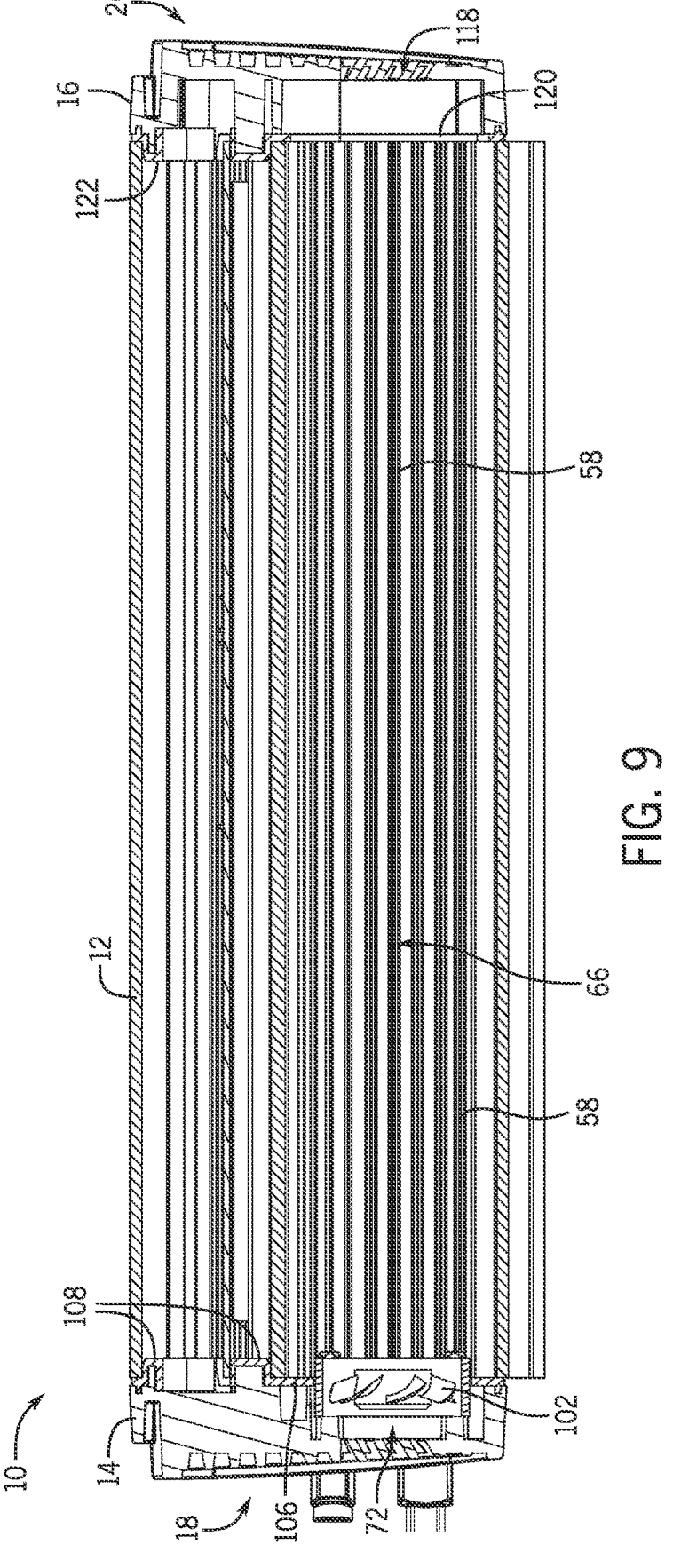
FIG. 9 is a cross-sectional view of the battery charger taken along the line 9-9 of FIG. 1.

Turning now to FIG. 9, a cross-sectional view of the system 10 taken along the line 9-9 is depicted. As shown and as described above, the fan 102 is mounted within the first end cap 14 such that when the first end cap 14 is mounted to the enclosure 12, the fan 102 is aligned with the convection passage 66 such that the fan 102 can force a flow of air past the internal fins 58 extending into the convection passage 66 and efficiently cool the power system components contained within the component space 64. As shown, the convection passage 66 extends the entire length of the enclosure 12 from the first end 18 to the second end 20, and thus there is no path for air that enters the convection passage 66 to cross into and enter the component space 64. The flow of air is permitted to enter and exit the enclosure 12 via the fan intake/exhaust openings 72, 118 respectively formed in the first end cap 14 and the second end cap 16.

This written description uses examples to disclose the invention, including the best mode, and to enable any person skilled in the art to make and use the invention. Certain terms have been used for brevity, clarity and understanding. No unnecessary limitations are to be inferred therefrom beyond the requirement of the prior art because such terms are used for descriptive purposes only and are intended to be broadly construed. The patentable scope of the invention is defined by the claims, and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

We claim:

1. A waterproof marine power supply system for a marine vessel, comprising:

an enclosure defining an interior region and extending from a first end to a second end, the enclosure comprising:

an upper wall and a lower wall positioned opposite each other;

a first peripheral wall and a second peripheral wall positioned opposite each other; and a convection passage wall extending within the interior region from the first end to the second end of the enclosure and separating a convection passage from a component space, the component space housing a plurality of power supply components;

a first end cap coupled to the first end of the enclosure;

a second end cap coupled to the second end of the enclosure; and a fan coupled to either the first end cap or the second end cap and configured to force a flow of air through the convection passage;

wherein the first end cap and the second end cap are coupled to the enclosure such that the component space is sealed against water intrusion and wherein the convection passage is not sealed against water intrusion.

2. The waterproof marine power supply system of claim 1, wherein at least a portion of the enclosure is fabricated from an extruded metal.

3. The waterproof marine power supply system of claim 2, wherein the extruded metal is aluminum.

4. The waterproof marine power supply system of claim 1, wherein the first end cap and the second end cap are fabricated from plastic.

5. The waterproof marine power supply system of claim 1, wherein each of the first end cap and the second end cap further comprises either a fan exhaust opening or a fan intake opening formed therein.

6. The waterproof marine power supply system of claim 1, wherein the power supply system is a battery charger, and wherein the plurality of power supply components is configured to convert an AC power input to a DC power output.

7. The water marine power supply system of claim 1, wherein the power supply system is an inverter, and wherein the plurality of power supply components is configured to covert a DC power input to an AC power output.

8. The waterproof marine power supply system of claim 1, wherein no portion of the convection passage wall comprises a touchable surface of the waterproof marine battery charger.

9. The waterproof marine power supply system of claim 1, further comprising a plurality of internal fins extending inwardly to the convection passage from at least one of the lower wall, the first peripheral wall, the second peripheral wall, and the convection passage wall.

10. The waterproof marine power supply system of claim 1, further comprising a plurality of external fins extending outwardly relative to the component space from the lower wall.

11. The waterproof marine power supply system of claim 1, further comprising a plurality of external fins extending outwardly relative to the component space from the first peripheral wall and the second peripheral wall.

12. The waterproof marine power supply system of claim 1, further comprising a plurality of internal fins extending inwardly to the component space from at least one of the first peripheral wall and the second peripheral wall.

13. The waterproof marine power supply system of claim 1, wherein the enclosure further comprises a pair of mounting flanges extending outwardly from the lower wall.

14. The waterproof marine power supply system of claim 1, wherein at least one of the plurality of power supply components is thermally coupled to the convection passage wall using a heat sink component and a thermal interface material.

15. The waterproof marine power supply system of claim 1, further comprising a first gasket positioned between the first end cap and the enclosure and a second gasket positioned between the second end cap and the enclosure.

16. The waterproof marine power supply system of claim 15, wherein each of the first gasket and the second gasket comprises a sealing ridge that is configured to extend around a perimeter of the component space and not configured to extend around a perimeter of the convection passage.

17. The waterproof marine power supply system of claim 1, wherein:

the fan is coupled to the first end cap;

the fan comprises a plurality of power and signal wires;

the first end cap further comprises a fan wiring pocket proximate the fan, the fan wiring pocket configured to permit the power and signal wires to pass through a pocket opening into the component space to connect to the fan.

18. The waterproof marine power supply system of claim 17, wherein the fan wiring opening is potted with a potting material to prevent against water intrusion.

19. The waterproof marine battery charger of claim 18, wherein the potting material is an epoxy.

20. The waterproof marine battery charger of claim 17, wherein the fan wiring pocket further comprises a sensor mounting hole, and wherein the waterproof marine battery charger further comprises a temperature sensor coupled to the sensor mounting hole.

21. A metal enclosure for a power supply system, the metal enclosure comprising:

an upper wall and a lower wall positioned opposite each other;

a first peripheral wall and a second peripheral wall positioned opposite each other, wherein the upper wall, the lower wall, the first peripheral wall, and the second peripheral wall collectively define an interior region and extend from a first end to a second end;

a convection passage wall extending between the lower wall and either the first peripheral wall or the second peripheral wall and from the first end to the second end, wherein the convection passage wall separates the interior region into a convection passage and a component space; and a first plurality of internal fins extending inwardly to the convection passage from at least one of the lower wall, the first peripheral wall, the second peripheral wall, and the convection passage wall; and wherein the metal enclosure is configured to couple to a first end cap at the first end and a second end cap at the second end such that the component space is sealed against water intrusion and the convection passage is not sealed against water intrusion.

22. The metal enclosure of claim 21, further comprising a second plurality of internal fins extending inwardly to the component space from at least one of the first peripheral wall and the second peripheral wall.

23. The metal enclosure of claim 21, wherein the enclosure is fabricated from extruded aluminum.

* * * * *